(12) United States Patent
Briggs et al.

(10) Patent No.: US 10,916,501 B2
(45) Date of Patent: Feb. 9, 2021

(54) BACK END OF LINE ELECTRICAL FUSE STRUCTURE AND METHOD OF FABRICATION

(71) Applicant: International Business Machines Corporation, Armonk, NY (US)

(72) Inventors: Benjamin D. Briggs, Waterford, NY (US); Lawrence A. Clevenger, Rhinebeck, NY (US); Michael Rizzolo, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/751,465

(22) Filed: Jan. 24, 2020

(65) Prior Publication Data
US 2020/0161239 A1 May 21, 2020

Related U.S. Application Data

(62) Division of application No. 15/839,505, filed on Dec. 12, 2017, now Pat. No. 10,615,119.

(51) Int. Cl.
*H01L 23/525* (2006.01)
*H01L 23/532* (2006.01)
*H01L 21/768* (2006.01)

(52) U.S. Cl.
CPC ........ *H01L 23/5256* (2013.01); *H01L 21/768* (2013.01); *H01L 23/53223* (2013.01);
(Continued)

(58) Field of Classification Search
CPC .......... H01L 23/5256; H01L 23/53223; H01L 23/53238; H01L 23/53295; H01L 23/53266
(Continued)

(56) References Cited

U.S. PATENT DOCUMENTS 4,227,168 A 10/1980 Knapp, Jr.
4,228,417 A 10/1980 Belcher
(Continued)

OTHER PUBLICATIONS

Non-Final Office Action received for U.S. Appl. No. 15/839,505 dated Jan. 10, 2019, 25 pages.
(Continued)

*Primary Examiner* — Mohammad M Hoque
(74) *Attorney, Agent, or Firm* — Amin, Turocy & Watson, LLP

(57) ABSTRACT

Techniques facilitating back end of line electrical fuse structure and method of fabrication are provided. A device can comprise a first metal interconnect formed in a dielectric layer of a semiconductor chip. The device can also comprise a second metal interconnect formed in the dielectric layer and adjacent to the first metal interconnect. Further, the device can comprise a vertical electrical fuse element comprising a first portion of a conductive material deposited on a first surface of the first metal interconnect and a second portion of the conductive material deposited on a second surface of the second metal interconnect. The vertical electrical fuse element can comprise a first region comprising a first thickness and a second region comprising a second thickness different than the first thickness.

18 Claims, 11 Drawing Sheets

(52) U.S. Cl.
CPC .. *H01L 23/53238* (2013.01); *H01L 23/53266* (2013.01); *H01L 23/53295* (2013.01)

(58) Field of Classification Search
USPC ...................................................... 257/529
See application file for complete search history.

(56) References Cited

U.S. PATENT DOCUMENTS

| | | | |
|---|---|---|---|
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 6,252,292 B1 | 6/2001 | Brintzinger et al. | |
| 6,294,453 B1* | 9/2001 | Marmillion | H01L 23/5256 257/529 |
| 6,754,135 B2 | 6/2004 | Pilo | |
| 6,897,543 B1 | 5/2005 | Huang et al. | |
| 6,998,865 B2 | 2/2006 | Bard et al. | |
| 7,157,782 B1 | 1/2007 | Shih et al. | |
| 7,272,067 B1 | 9/2007 | Huang et al. | |
| 7,288,804 B2 | 10/2007 | Booth, Jr. et al. | |
| 7,485,944 B2 | 2/2009 | Kothandaraman et al. | |
| 7,576,407 B2* | 8/2009 | Ko | H01L 23/5256 257/529 |
| 7,671,443 B2* | 3/2010 | Lee | H01L 23/5258 257/529 |
| 7,759,766 B2 | 7/2010 | Booth, Jr. et al. | |
| 7,960,760 B2* | 6/2011 | Marshall | H01L 23/5256 257/209 |
| 8,586,466 B2 | 11/2013 | Lee et al. | |
| 9,059,170 B2 | 6/2015 | Bao et al. | |
| 9,087,842 B2* | 7/2015 | Choi | H01L 21/76843 |
| 9,646,929 B2 | 5/2017 | Chen et al. | |
| 9,685,404 B2 | 6/2017 | Bao et al. | |
| 2001/0042897 A1* | 11/2001 | Yeh | H01L 23/5256 257/529 |
| 2005/0269666 A1* | 12/2005 | Chung | H01L 23/5256 257/528 |
| 2007/0273002 A1 | 11/2007 | Hwang | |
| 2008/0007986 A1* | 1/2008 | Jeong | G11C 17/165 365/96 |
| 2008/0217735 A1 | 9/2008 | Chen et al. | |
| 2009/0230506 A1* | 9/2009 | Park | H01L 23/5258 257/529 |
| 2009/0261450 A1* | 10/2009 | Cheng | H01L 23/5256 257/529 |
| 2009/0302417 A1* | 12/2009 | Kim | H01L 23/5256 257/529 |
| 2010/0109122 A1* | 5/2010 | Ding | H01L 21/76892 257/529 |
| 2011/0001212 A1* | 1/2011 | Kim | H01L 23/5258 257/529 |
| 2011/0001213 A1* | 1/2011 | You | H01L 23/5256 257/529 |
| 2011/0140234 A1* | 6/2011 | Shin | H01L 23/5258 257/529 |
| 2011/0212613 A1* | 9/2011 | Kim | H01L 23/5258 438/601 |
| 2012/0261793 A1* | 10/2012 | Yang | H01L 23/5256 257/529 |
| 2013/0134519 A1* | 5/2013 | Sengoku | H01L 23/5256 257/364 |
| 2014/0319651 A1* | 10/2014 | Wu | H01L 23/5256 257/529 |
| 2014/0353796 A1* | 12/2014 | Lavoie | H01L 21/283 257/529 |
| 2015/0097266 A1* | 4/2015 | Li | H01L 21/7684 257/529 |
| 2015/0325809 A1* | 11/2015 | Yoshida | H05B 33/04 257/40 |
| 2016/0329282 A1* | 11/2016 | Lee | H01L 29/66545 |
| 2018/0261541 A1* | 9/2018 | Kimura | H01L 21/76894 |
| 2018/0315564 A1 | 11/2018 | Sherrima | |

OTHER PUBLICATIONS

Rizzolo et al., "IBM System z9 eFUSE Applications and Methodology", IBM Journal of Research and Development, vol. 51, Issue 1-2, Jan. 2007, pp. 65-75.
Wu et al., "Investigation of Electrical Programmable Metal Fuse in 28nm and beyond CMOS Technology", Joint 2011 IEEE International Interconnect Technology Conference (IITC) & 2011 Materials for Advanced Metallization (MAM), IEEE, May 2011, 3 pages.
List of IBM Patents or Applications Treated as Related.

* cited by examiner

BACK END OF LINE ELECTRICAL FUSE STRUCTURE AND METHOD OF FABRICATION

BACKGROUND

The subject disclosure relates to semiconductor structures and semiconductor fabrication, and more specifically to semiconductor structures and semiconductor fabrication that comprise electrical fuse devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, methods, computer-implemented methods, apparatuses, and/or computer program products that facilitate back end of line electrical fuse structure and method of fabrication are provided.

According to an embodiment a device can comprise a first metal interconnect formed in a dielectric layer of a semiconductor chip. The device can also comprise a second metal interconnect formed in the dielectric layer and adjacent to the first metal interconnect. Further, the device can comprise a vertical electrical fuse element comprising a first portion of a conductive material deposited on a first surface of the first metal interconnect and a second portion of the conductive material deposited on a second surface of the second metal interconnect. The vertical electrical fuse element can comprise a first region comprising a first thickness and a second region comprising a second thickness different than the first thickness.

Another embodiment relates to a method that can comprise forming a first metal interconnect in a dielectric layer of a semiconductor device and forming a second metal interconnect in the dielectric layer and adjacent to the first metal interconnect. The method can also comprise depositing a first portion of a conductive material on a first surface of the first metal interconnect and a second portion of the conductive material on a second surface of the second metal interconnect. Further, the method can comprise growing the first portion of the conductive material and the second portion of the conductive material into a vertical fuse element that electrically connects the first metal interconnect and the second metal interconnect. Growing the first portion and the second portion can comprise growing the first portion to a first thickness and growing the second portion to a second thickness different from the first thickness.

A further embodiment relates to a vertical electrical fuse device that can comprise a first metal interconnect formed in a dielectric layer of a semiconductor chip and a second metal interconnect formed in the dielectric layer and adjacent to the first metal interconnect. The vertical electrical fuse device can also comprise a vertical electrical fuse element comprising a first portion of a conductive material deposited on a first surface of the first metal interconnect and in contact with a second portion of the conductive material deposited on a second surface of the second metal interconnect. The vertical electrical fuse element can comprise a first region comprising a first thickness and a second region comprising a second thickness different than the first thickness.

These and other features will become apparent from the following detailed description of illustrative embodiments thereof, which is to be read in connection with the accompanying drawings.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Electrical fuse devices (also referred to as "electrical fuses" or "eFuses") can be used in the semiconductor industry during fabrication of a semiconductor chip to implement array redundancy, field programmable arrays, analog component trimming circuits, and chip identification circuits. In some implementations, hundreds, or even thousands, of electrical fuse devices can be included on a single semiconductor chip or a single computer chip. For example, as it relates to semiconductor chips, electrical fuse devices can be placed in the circuits and, after fabrication, can be caused to "break" (e.g., interrupt the electrical current) deliberately to configure the semiconductor chip or to program the semiconductor chip.

According to some examples, one or more electrical fuses can be "broken" to program the semiconductor chip for a defined function and/or to limit performance of the semiconductor chip (e.g., to sell the semiconductor chip at a lower cost or to sell a product that includes the semiconductor chip at a lower cost). The program state of the electrical fuse is not reversible (e.g., the fuse does not revert to its original state) and, therefore, can be referred to as one-time-programmable memory elements.

The programming of the large number of electrical fuse devices incorporated on the semiconductor chip can add time (which could be a significant amount of time) to the semiconductor chip fabrication process. Therefore, to increase processing efficiencies, the electrical fuse devices provided herein can be configured to break quickly, with a low amount of electrical current, and predictably. In addition, the various aspects discussed herein provide an electrical fuse device that can have a reduced size or smaller footprint, which can reduce an overall size of the semiconductor chip, or which can facilitate space for other devices to be included on the semiconductor chip.

Figure 1A:
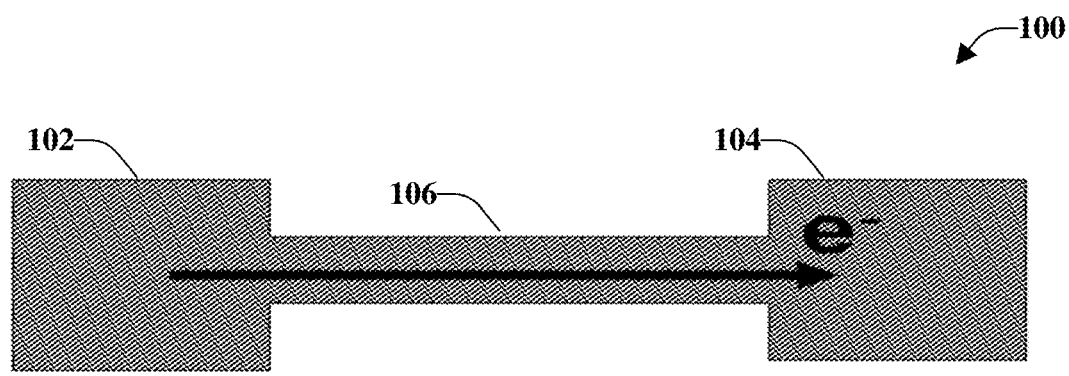
FIG. 1A illustrates a top view of an example, non-limiting schematic representation of an electrical fuse device in accordance with one or more embodiments described herein.

FIG. 1A illustrates a top view of an example, non-limiting schematic representation of an electrical fuse device 100 in accordance with one or more embodiments described herein. As illustrated, the electrical fuse device 100 can comprise a first interconnect 102 and a second interconnect 104 (e.g., metal interconnects). The first interconnect 102 and the second interconnect 104 can define the positive and negative terminals of the electrical fuse device 100. According to some implementations, the first interconnect 102 can be a cathode of the electrical fuse device 100 and the second interconnect 104 can be an anode of the electrical fuse device 100. However, in some implementations, the first interconnect 102 can be the anode of the electrical fuse device 100 and the second interconnect 104 can be the cathode of the electrical fuse device 100. The first interconnect 102 and the second interconnect 104 can be formed of a metal, such as copper.

The electrical fuse device 100 can also comprise a fuse element 106 that can electrically connect the first interconnect 102 and the second interconnect 104. The fuse element 106 can be a narrow strip of a conductive material, such as a metal, adjoining the first interconnect 102 and the second interconnect 104. The fuse element 106 can be formed from at least one conductive material selected from a group of conductive materials comprising copper (Cu), aluminum (Al), metal silicide, cobalt (Co), ruthenium (Ru), and tungsten (W). The fuse element 106 can be grown on the first interconnect 102 and the second interconnect 104. For example, respective thin films of the selected conductive material can be deposited and grown on the first interconnect 102 and the second interconnect 104. The selected conductive material can be grown such that respective thin films of the selected conductive material expand wider than the first interconnect 102 and the second interconnect 104. Further, the respective thin films can merge or contact one another at a connection point, which can electrically connect the first interconnect 102 and the second interconnect 104.

The fuse element 106 can have a narrow cross-sectional area and can be configured to "break" as discussed above. For example, as the respective thin films of the selected conductive material are grown on the first interconnect 102 and the second interconnect 104, the respective thin films can grow both vertically (e.g., expand wider) and also horizontally (e.g., grow thicker). Areas of the respective thin films that are above the first interconnect 102 and the second interconnect 104 can be grown thicker than other areas. For example, the respective thin films can grow in a "mushroom cap-type" shape. Accordingly, the connection point between the respective thin films can be narrower than the areas above the first interconnect 102 and the second interconnect 104, which will be illustrated below with respect to FIGS. 4 and 7.

Figure 1B:
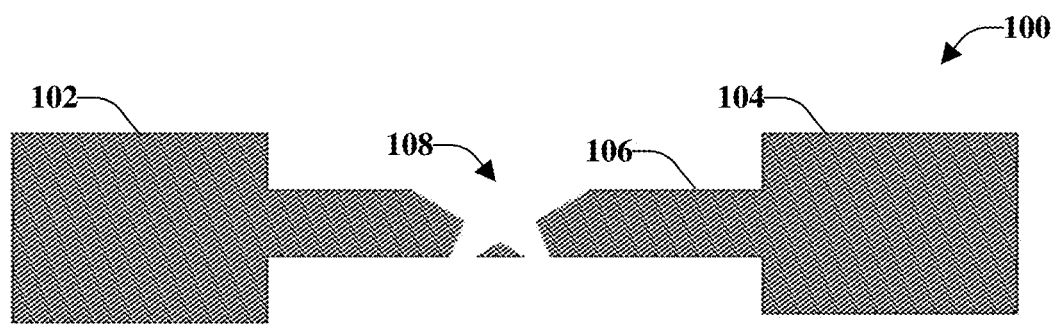
FIG. 1B illustrates a top view of the example, non-limiting electrical fuse device of FIG. 1A in an open state in accordance with one or more embodiments described herein.

FIG. 1B illustrates a top view of the example, non-limiting electrical fuse device 100 of FIG. 1A in an open state in accordance with one or more embodiments described herein. During programming of the electrical fuse device 100, a positive voltage bias can be applied to the first interconnect 102 (e.g., the anode) and a negative voltage bias can be applied to the second interconnect 104 (e.g., the cathode). As electrical current flows through the fuse element 106 (e.g., represented by the arrow in FIG. 1A), the temperature of the fuse element 106 can be elevated. The elevated temperature can cause the fuse element 106 to "break", as indicated by a circuit open site 108. An amount of electrical current flowing through the fuse element can be dependent on the fuse design. According to an implementation, the electrical current can be within the range of around 0.1 mA to about 25 mA.

For example, a high current density combined with an elevated temperature at the fuse element 106 can facilitate electromigration of the conductive material. The conductive material can be electromigrated under these conditions (e.g., the high current density and the elevated temperature) from a portion of the electrical fuse structure, thereby increasing the resistance of the electrical fuse structure. An in-plane dimensional difference can be utilized to localize the circuit open site 108 via a high electron/current flow. For example, a portion of the fuse element 106 can have a width that can be smaller than other portions of the fuse element 106, which can be referred to as a defined dimension or a critical dimension. According to some implementations, the portion of the fuse element 106 that represents the connection point between the respective thin films can be the defined dimension (e.g., the critical dimension).

As discussed in further detail below, selective conductive material deposition and growth of the conductive material can be utilized to control the defined dimension. The defined dimension of the electrical fuse device 100 as provided herein is not controlled by a lithography process, which limits the thickness of the fuse element to being as narrow as the narrowest lithography dimension. Instead, the various aspects can provide an electrical fuse device 100 that can comprise a fuse element that can be narrower than the narrowest lithography dimension. Accordingly, the electrical fuse device 100 can break faster, with less current, and reliably.

Figure 2:
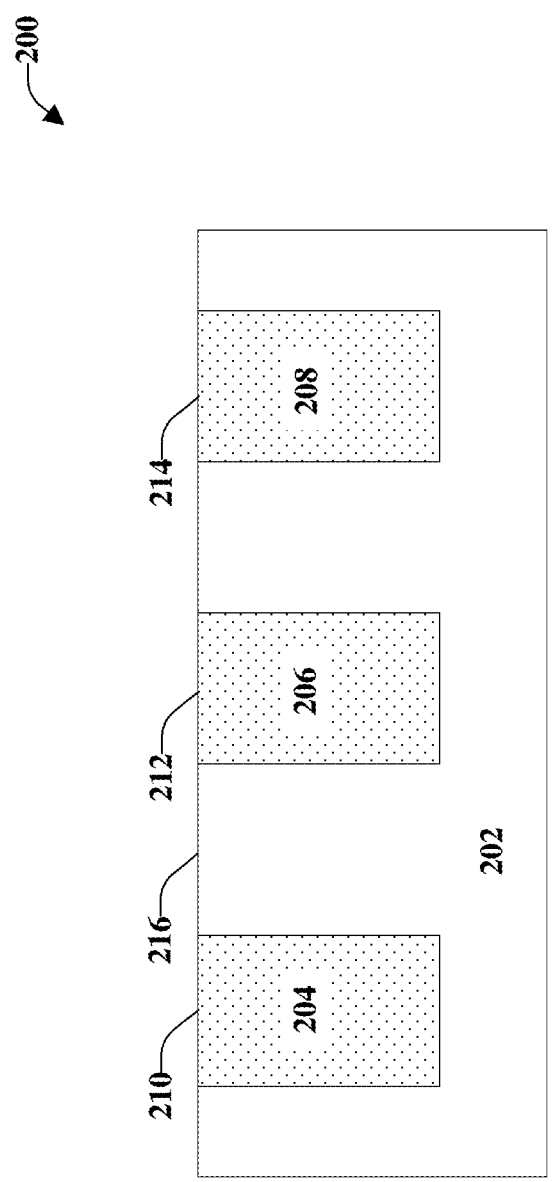
FIG. 2 illustrates a cross-sectional view of formation of a fuse structure in a portion of a semiconductor device in accordance with one or more embodiments described herein.

FIG. 2 illustrates a cross-sectional view of formation of a fuse structure 200 in a portion of a semiconductor device in accordance with one or more embodiments described herein. The various aspects discussed herein relate to a back end of line (BEOL) process, which is a second portion of an integrated chip fabrication. Accordingly, details related to a front end of line (FEOL) process, or the first portion of the integrated chip fabrication, are not illustrated or described for purposes of simplicity. During BEOL processing, various individual devices can be interconnected with wiring on a wafer, which can be the metalization layer. The various individual devices can include, but are not limited to, transistors, capacitors, resistors, and fuse devices.

Illustrated in FIG. 2 is a dielectric layer 202 (e.g., an interlevel dielectric layer) that can comprise dielectric material (e.g., isolator material or electrical isolators) that can be used to electrically separate interconnect lines (e.g., wires). The interconnect lines can be closely spaced to one another and can be arranged in several layers (e.g., multilevel metallization). It is noted that although only a single dielectric layer is illustrated, there can be one or more dielectric layers above and/or below the illustrated dielectric layer.

According to some implementations, the dielectric layer 202 can be any interconnect layer of the semiconductor device. The dielectric layer 202 can include various dielectric material including, for example, silicon oxide ($SiO_2$), silicon nitride ($Si_3N_4$), dielectric materials comprising silicon (Si), carbon (C), oxygen (O), and hydrogen (H) atoms (SiCOSH), silicon based low-k dielectrics, or porous dielectrics.

According to some implementations, various deposition techniques can be utilized to form the dielectric layer 202. Examples of deposition techniques can include atomic layer deposition, chemical vapor deposition, physical vapor deposition, plasma enhanced chemical vapor deposition, and/or spin on deposition. Further, the dielectric layer 202 can comprise a thickness from around 100 nm to about 150 nm, however, thicknesses above 100 nm or below 150 nm may also be utilized.

One or more pads or terminals (illustrated as a first interconnect 204, a second interconnect 206, and a third interconnect 208) can be formed in the dielectric layer 202. For example, respective portions of the dielectric layer 202 can be etched, to form a trench, and filled with material, such as copper (Cu), aluminum (Al), or tungsten (W) to form the one or more interconnects. Various filling techniques can be utilized to fill the trench including, for example, chemical vapor deposition, electroplating, electroless plating, physical vapor deposition, or combinations thereof. In some implementations, the interconnect can include a dopant including, for example, aluminum (Al), copper (Cu), magnesium (Mg), manganese (Mn), and so on.

Pairs of interconnects can be utilized to define the positive and negative terminals of a fuse device (e.g., the anode and the cathode). Thus, the one or more interconnects can be lines or wires (e.g., copper lines, copper wires) that define the interconnects of the electrical fuse device. It is noted that although only three interconnects are illustrated for purposes of simplicity, according to various aspects an integrated circuit can include more than three interconnects.

After the one or more portions of the dielectric layer 202 are filled to create the one or more interconnects, chemical-mechanical planarization (CMP) can be performed on the dielectric layer 202, the first interconnect 204, the second interconnect 206, and the third interconnect 208. CMP is a polishing process that can be utilized to smooth surfaces. For example, CMP can utilize a chemical slurry formation and a mechanical polishing process to obtain the smooth surfaces. As illustrated, the CMP can create a level surface across respective surfaces of the dielectric layer 202, the first interconnect 204, the second interconnect 206, and the third interconnect 208. For example, the first interconnect 204 can comprise a first surface 210, the second interconnect 206 can comprise a second surface 212, and the third interconnect 208 can comprise a third surface 214. The first surface 210, the second surface 212, and the third surface 214 can be level (or substantially level) with a top surface 216 of the dielectric layer 202. Thus, FIG. 2 illustrates fabrication of the fuse structure 200 after completion of the CMP process.

Figure 3:
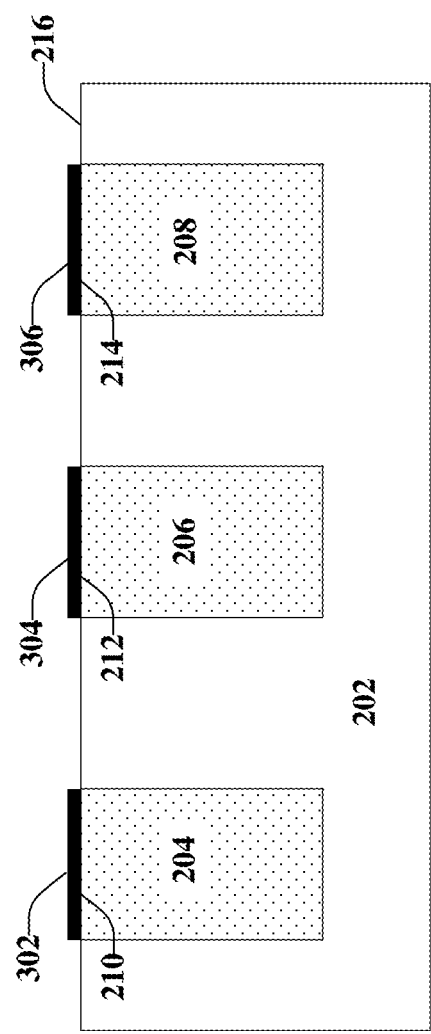
FIG. 3 illustrates a cross-sectional view of selective conductive material deposition during formation of the fuse structure of FIG. 2 in accordance with one or more embodiments described herein.

FIG. 3 illustrates a cross-sectional view of selective conductive material deposition during formation of the fuse structure 200 of FIG. 2 in accordance with one or more embodiments described herein. Repetitive description of like elements employed in other embodiments described herein is omitted for sake of brevity.

A thin film comprising a conductive material can be selectively deposited on the surfaces of the one or more interconnects. For example, the respective portions of a thin film can be deposited on the first surface 210 of the first interconnect 204, the second surface 212 of the second interconnect 206, and the third surface 214 of the third interconnect 208. According to some implementations, the conductive material can be selected from a group of materials comprising copper (Cu), aluminum (Al), metal silicide, cobalt (Co), ruthenium (Ru), and/or tungsten (W).

In an example, a first portion 302 of the thin film or conductive material can be deposited on the first surface 210 of the first interconnect 204, a second portion 304 of the thin film can be deposited on the second surface 212 of the second interconnect 206, a third portion 306 of the thin film can be deposited on the third surface 214 of the third interconnect 208, and so on. The respective portions of the thin film (e.g., the first portion 302, the second portion 304, and the third portion 306) can be deposited across the entire width (e.g., the surfaces) of the respective interconnects or can be deposited across at least a portion of the width of the respective interconnects.

Figure 4:
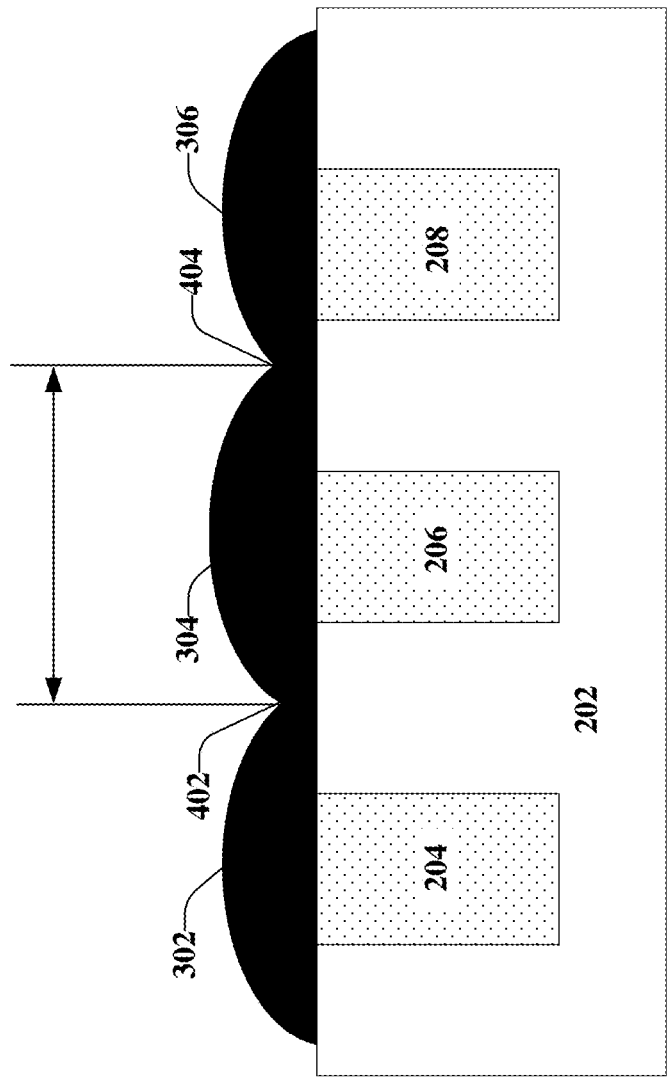
FIG. 4 illustrates a cross-sectional view of a portion of the fabrication process when a thin film is grown on interconnects of the fuse structure of FIG. 3 in accordance with one or more embodiments described herein.

After deposition of the thin film, the thin film can grow on the interconnects, as depicted in FIG. 4 which illustrates a cross-sectional view of a portion of the fabrication process when the thin film is grown on the interconnects of the fuse structure 200 of FIG. 3 in accordance with one or more embodiments described herein. Repetitive description of like elements employed in other embodiments described herein is omitted for sake of brevity.

It is noted that the thin film does not grow on the dielectric layer 202. However, the thin films can grow in such a manner that portions of the top surface 216 of the dielectric layer 202 can be covered by the thin films. For example, as compared with the thin film portions of FIG. 3, the thin film (e.g., the first portion 302, the second portion 304, and the third portion 306) can grow vertically and horizontally (e.g., thicker and wider). According to some implementations, the portions of the thin film can grow in a manner that represents a "mushroom cap-type" shape. For example, rather than growing merely in a vertical direction, the thin film can expand both upward (e.g., vertically) and outward (e.g., horizontally). Accordingly, a first thickness of the thin film above the interconnects can be thicker than a second thickness of the thin film between adjacent interconnects and, therefore, the fuse device can have a variable fuse element thickness. For example, a thickness of the fuse element at a first end or region can be narrower than a middle portion and another thickness of the fuse element at a second end (opposite the first end) can be narrower than the middle portion. According to some implementations, the fuse elements can comprise a thickness ranging between about 1 nm and around 50 nm.

According to some implementations, a width and/or a height of the respective thin film portions can be defined based on an amount of thin film deposited and/or based on a spacing or distance between the interconnects. For example, the width, illustrated by the arrow dimension, of the second portion 304 of the thin film can be defined between a first connection point 402 with the first portion 302 of the thin film and a second connection point 404 with the third portion 306 of the thin film. The connection points (e.g., the first connection point 402, the second connection point 404) can be a defined dimension (e.g., a critical dimension) of the fuse structure 200. The defined dimension can be based on a thickness of the fuse element created by the merging or joining of the thin film portions.

According to an example, one or more trenches can be formed in the dielectric layer 202 and can be filled with a material, such as copper, to create respective metal anodes and respective metal cathodes of one or more electrical fuse devices of an integrated circuit. Respective portions of thin film can be deposited and grown on the filled trenches. For example, a first thin film can be deposited on the material used the fill a first trench, a second thin film can be deposited on the material used the fill a second trench, a third thin film can be deposited on the material used the fill a third trench, a fourth thin film can be deposited on the material used the fill a fourth trench, and so on.

As the thin films grow, the thin films can expand upward (e.g., vertically) and outward (e.g., horizontally). As the thin films expand outward, the thin films can merge with adjacent thin films. For example, as the first thin film, the second thin film, and the third thin film grow, the first thin film and the second thin film can merge together at a first connection point. Further, the second thin film and the third thin film can merge together at a second connection point. In a similar manner, growth of the third thin film and the fourth thin film can cause the third thin film and the fourth thin film to merge together at a third connection point.

According to some implementations, an amount of thin film deposited on the filled trenches can be utilized to determine a defined dimension of the fuse element. For example, a lesser amount of thin film deposited (e.g., a thinner amount) can result in a narrower element thickness and, therefore, the thin film does not grow as large (vertically and horizontally) as a device that has a larger amount of thin film deposited (e.g., a thicker amount). In a similar manner, if a larger amount of thin film is deposited, it can result in a thicker fuse element and, therefore, the thin film can grow larger (vertically and horizontally) as compared with a fuse element device that has a smaller amount of thin film deposited. Thus, a selection of a thicker amount of material can cause a pinch point (e.g., the defined dimension) to be larger and another selection of a thinner amount of material can cause the pinch point to be smaller. A semiconductor chip can comprise electrical fuse devices that comprise various fuse element thicknesses across the semiconductor chip.

According to an additional or alternative implementation, a spacing between the interconnects (or the filled trenches) can be utilized to determine the defined dimension of the fuse element. Thus, the spacing can determine an amount of material that is grown before the two thin films merge together, which can define the height. The spacing can be determined during a design of the initial structure of the semiconductor chip. It is noted that the interconnects (or filled trenches) illustrated comprise uniform spacing therebetween. However, in various implementations, one or more adjacent interconnects can be closer together than other interconnects or can be farther apart than other interconnects. Accordingly, the one or more interconnects within the semiconductor device can have uniform spacing therebetween, non-uniform spacing therebetween, or variable spacing therebetween.

The one or more thin films (e.g., the first thin film, the second thin film, the third thin film, and so on) can comprise different thicknesses. In a non-limiting example, the first thin film can comprise a thickness of about 17.8 nm, the second thin film can comprise a thickness of around 18.9 nm, the third thin film can comprise a thickness of about 18.3 nm, and the fourth thin film can comprise a thickness around 20.3 nm. It is noted that the thicknesses of the fuse elements described are for example purposes only and the various aspects are not limited to these specific thicknesses.

Accordingly, as discussed herein the one or more fuse elements across the semiconductor device can have various element thicknesses. It is noted that the thicknesses obtained by selective deposition of the thin film can be narrower than a thickness defined by a lithography process. It is also noted that although the thin films described in the example embodiments comprise different thicknesses, one or more of the thin films can have a same or similar thickness.

Figure 5:
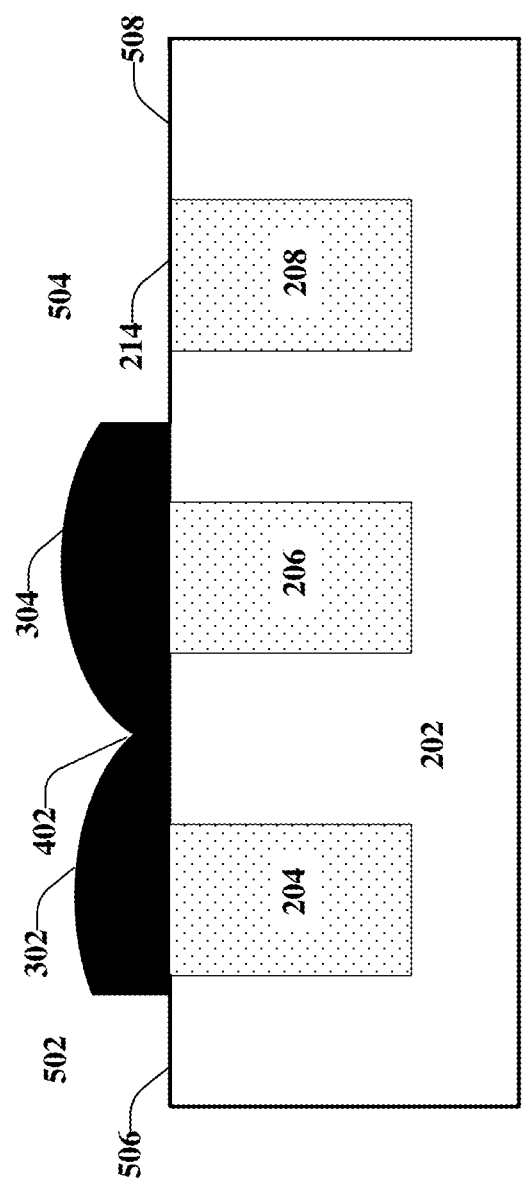
FIG. 5 illustrates a cross-sectional view of block mask and patterning processes during formation of the fuse structure of FIG. 4 in accordance with one or more embodiments described herein.

FIG. 5 illustrates a cross-sectional view of block mask and patterning processes during formation of the fuse structure 200 of FIG. 4 in accordance with one or more embodiments described herein. Repetitive description of like elements employed in other embodiments described herein is omitted for sake of brevity.

In order to control a width of the thin film across the device, selective portions of the thin film can be block mask and patterned. For example, a first area 502 of the thin film and a second area 504 of the thin film can be selectively removed or "cut."

In further detail, a mask can be applied to remove the first area 502 and the second area 504 in order to expose portions of the dielectric layer. For example, removal of the first area 502 can expose a first portion 506 of the dielectric layer 202 and removal of the second area 504 can expose a second portion 508 of the dielectric layer 202. In the example of FIG. 5, removal of the second area 504 can also expose the third surface 214 of the third interconnect 208.

By exposing the second portion 508 and the third surface 214 of the third interconnect 208, the fuse element can be created by the first portion 302 of the thin film and the second portion 304 of the thin film. The first portion 302 can comprise a first region of the fuse element and the second portion 304 can comprise a second region of the fuse element. Further, the first region and the second region can comprise different thicknesses. The created fuse element can electrically connect the first interconnect 204 and the second interconnect 206. Further, during programming of the fuse structure, the fuse element can be "broken" at, or within a defined distance of, the defined dimension (e.g., the first connection point 402) located between the first portion 302 of the thin film and the second portion 304 of the thin film.

As previously mentioned, the defined dimension (e.g., the critical dimension) can be defined by the fuse element deposition (e.g., depositing the first portion 302 of the thin film and the second portion 304 of the thin film). Accordingly, the defined dimension is not limited by a lithography process, which limits the thickness of the fuse element to being as narrow as the narrowest lithography dimension.

Thus, the electrical fuse device provided herein can break faster, with less current, and more reliably as compared to an electrical fuse device that has a critical dimension defined by the lithography process.

Figures 6A, 6B:
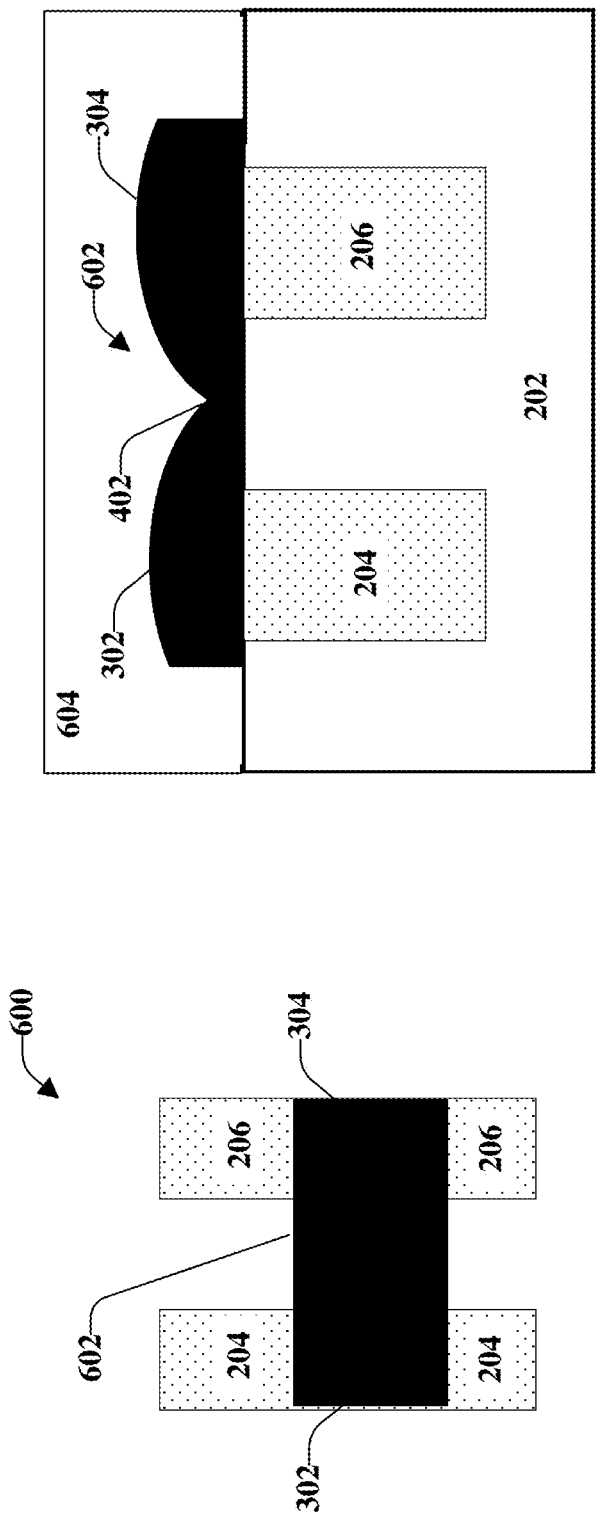
FIG. 6A illustrates a top-view of an example, non-limiting embodiment of a fuse structure after fabrication in accordance with one or more embodiments described herein.
FIG. 6B illustrates a cross-sectional view of the fuse structure of FIG. 6A in accordance with one or more embodiments described herein.

FIG. 6A illustrates a top-view of an example, non-limiting embodiment of a fuse structure 600 after fabrication in accordance with one or more embodiments described herein. FIG. 6B illustrates a cross-sectional view of the fuse structure 600 of FIG. 6A in accordance with one or more embodiments described herein. Repetitive description of like elements employed in other embodiments described herein is omitted for sake of brevity.

As illustrated, a fuse element 602 connects (e.g., electrically connects) the first interconnect 204 and the second interconnect 206. The fuse element 602 can be created by depositing and growing the first portion 302 of the thin film on the first interconnect 204 and the second portion 304 of the thin film on the second interconnect 206. The first portion 302 and the second portion 304 can grow horizontally and vertically. The vertical expansion or growth of the portions (e.g., the first portion 302 and the second portion 304) can cause the portions to contact one another, such as at the first connection point 402.

According to some implementations, the first portion 302 and the second portion 304 can grow in a manner that represents a "mushroom cap-type" shape. However, it is noted that the growth of the thin film portions can represent other shapes and a mushroom cap-type shape is described for purposes of explaining the disclosed aspects.

As depicted in FIG. 6B, the fuse element 602 can be surrounded by a dielectric layer 604. The dielectric layer 604 can be formed from an electrically insulating material, a dielectric material, or a combination thereof. Further, the dielectric layer 604 can be formed using, but not limited to, a physical vapor deposition process, a chemical vapor deposition process, a spin-on deposition process, or combinations thereof.

Figure 7:
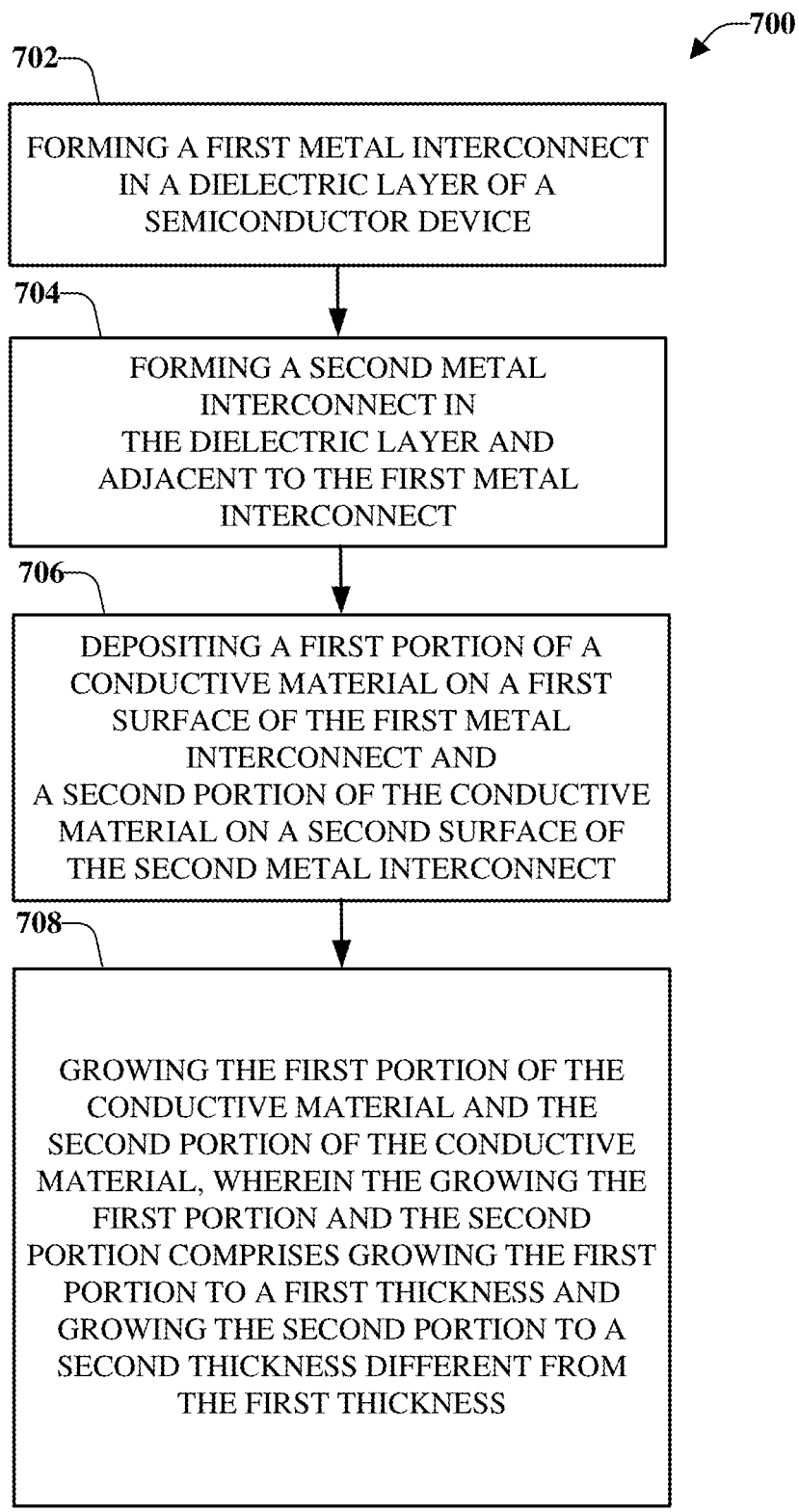
FIG. 7 illustrates a flow diagram of an example, non-limiting method for fabricating an electrical fuse device for back end of line electrical fuse integration in accordance with one or more embodiments described herein.

FIG. 7 illustrates a flow diagram of an example, non-limiting method 700 for fabricating an electrical fuse device for back end of line electrical fuse integration in accordance with one or more embodiments described herein. Repetitive description of like elements employed in other embodiments described herein is omitted for sake of brevity.

The method 700 starts, at 702, when a first metal interconnect (e.g., the first interconnect 102, the first interconnect 204) can be formed in a dielectric layer (e.g., the dielectric layer 202) of a semiconductor device. To form the first metal interconnect, a portion of the dielectric layer can be etched to form a trench, which can be filled with a material, such as copper, for example.

A second metal interconnect (e.g., the second interconnect 104, the second interconnect 206) can be formed in the dielectric layer and adjacent to the first metal interconnect, at 704. To form the second metal interconnect, a portion of the dielectric layer can be etched to form a trench, which can be filled with a material, such as copper, for example. A spacing between the first metal interconnect and the second metal interconnect can be determined to define a thickness of a fuse element. According to some implementations, the first metal interconnect and the second metal interconnect can be formed at about the same time or at different times.

At 706, a first portion of a conductive material (e.g., the first portion 302) can be deposited on a first surface (e.g., the first surface 210) of the first metal interconnect and a second portion of the conductive material (e.g., the second portion 304) can be deposited on a second surface (e.g., the second surface 212) of the second metal interconnect. According to some implementations, the conductive material can be a thin film selected from a group of materials comprising copper (Cu), aluminum (Al), metal silicide, cobalt (Co), ruthenium (Ru), and tungsten (W).

Further, at 708, the first portion of the conductive material and the second portion of the conductive material can be grown into a vertical fuse element. The fuse element can electrically connect the first metal interconnect and the second metal interconnect. Growing the first portion and the second portion can comprise growing the first portion to a first thickness and growing the second portion to a second thickness different from the first thickness. Based on a vertical expansion of the first portion of the conductive material and the second portion of the conductive material, the first portion and the second portion can merge together forming the fuse element. The horizontal expansion of the first portion and the second portion can define a width of the fuse element (e.g., a defined dimension, a critical dimension).

Figure 8:
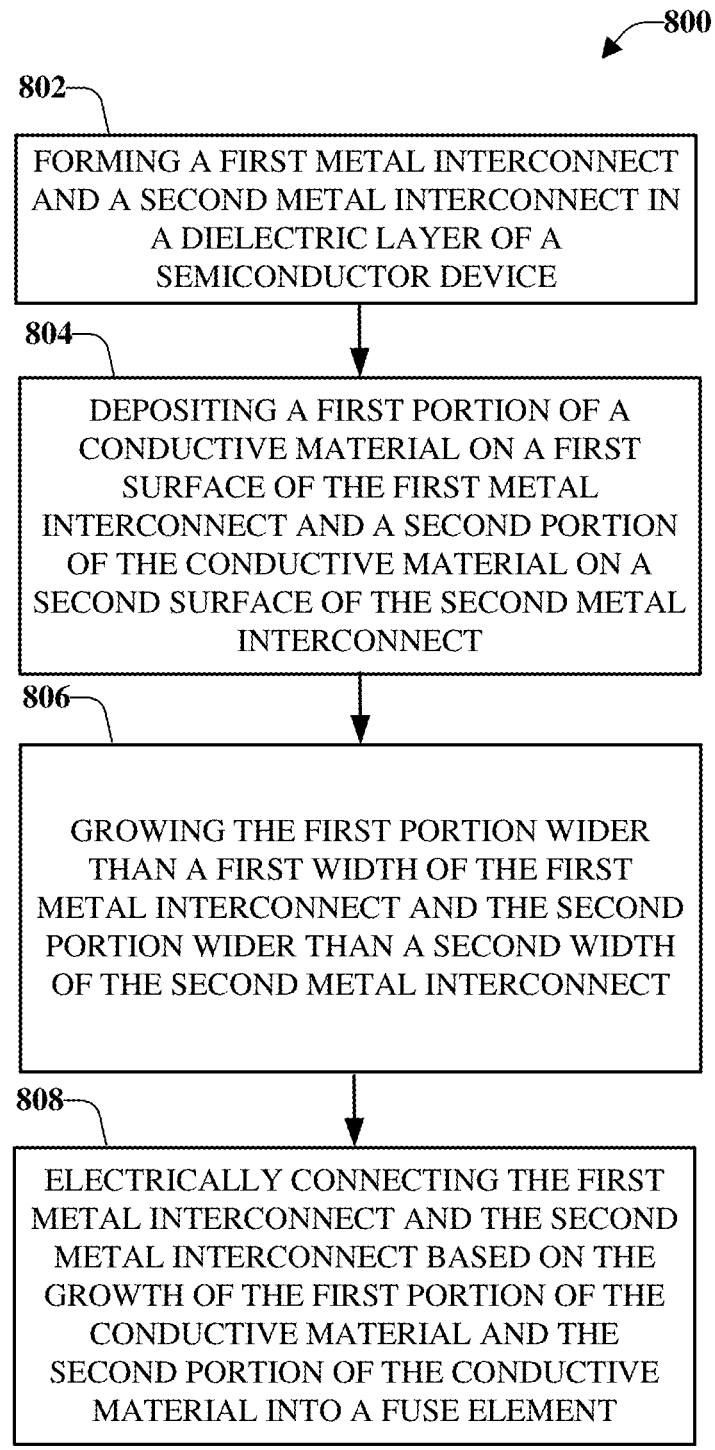
FIG. 8 illustrates a flow diagram of another example, non-limiting method for fabricating an electrical fuse device for back end of line electrical fuse integration in accordance with one or more embodiments described herein.

FIG. 8 illustrates a flow diagram of another example, non-limiting method 800 for fabricating an electrical fuse device for back end of line electrical fuse integration in accordance with one or more embodiments described herein. Repetitive description of like elements employed in other embodiments described herein is omitted for sake of brevity.

At 802 a first metal interconnect (e.g., the first interconnect 102, the first interconnect 204) and a second metal interconnect (e.g., the second interconnect 104, the second interconnect 206) can be formed in a dielectric layer (e.g., the dielectric layer 202) of a semiconductor device. To form the first metal interconnect and the second metal interconnect, respective portions of the dielectric layer can be etched to form trenches, which can be filled with a material, such as copper, for example. According to some implementations, the first metal interconnect and the second metal interconnect can be formed at about the same time. However, in other implementations, the first metal interconnect and the second metal interconnect can be formed at different times, such as consecutively, for example.

At 804, a first portion of a conductive material (e.g., the first portion 302) can be deposited on a first surface (e.g., the first surface 210) of the first metal interconnect and a second portion of the conductive material (e.g., the second portion 304) can be deposited on a second surface (e.g., the second surface 212) of the second metal interconnect. Further, other portions of the conductive material (or another conductive material) can be selectively deposited on other surfaces of other metal interconnects. According to some implementations, the conductive material can be a thin film selected from a group of materials comprising copper (Cu), aluminum (Al), metal silicide, cobalt (Co), ruthenium (Ru), and tungsten (W).

At 806, the method 800 can include growing the first portion of the conductive material and the second portion of the conductive material into a vertical fuse element that electrically connects the first metal interconnect and the second metal interconnect. According to an implementation, growing the first portion and the second portion can comprise growing the first portion to a first thickness and growing the second portion to a second thickness different from the first thickness.

At 808, the first portion can be grown wider than a first width of the first metal interconnect and the second portion can be grown wider than a second width of the second metal interconnect. A first height of the first portion and a second height of the second portion can be thicker above the first metal interconnect and the second metal interconnect than a third height of the first portion and a fourth height of the second portion at a connection point between the first portion and the second portion. Accordingly, the fuse element can comprise various fuse element thicknesses across the vertical electrical fuse device.

The first metal interconnect and the second metal interconnect can be electrically connected, at 808, based on a growth of the first portion of the conductive material and the second portion of the conductive material into a fuse element.

Figure 9:
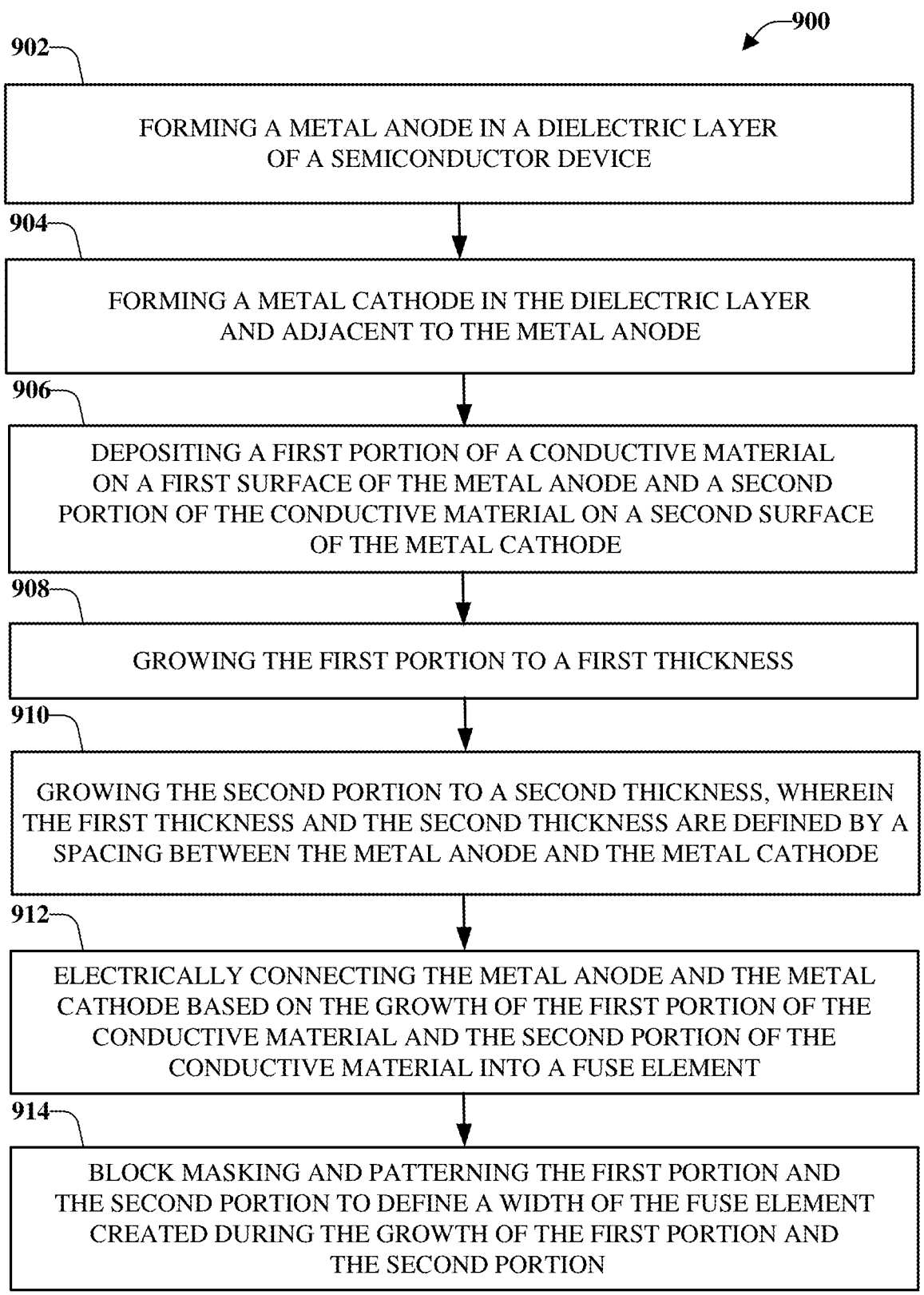
FIG. 9 illustrates a flow diagram of an example, non-limiting method for fabricating a three-dimensional vertical electrical fuse device in accordance with one or more embodiments described herein.

FIG. 9 illustrates a flow diagram of an example, non-limiting method 900 for fabricating a three-dimensional vertical electrical fuse device in accordance with one or more embodiments described herein. Repetitive description of like elements employed in other embodiments described herein is omitted for sake of brevity.

The method 900 starts, at 902, when a metal anode (e.g., the first interconnect 102, the first interconnect 204) can be formed in a dielectric layer (e.g., the dielectric layer 202) of a semiconductor device. At 904, a metal cathode (e.g., the second interconnect 104, the second interconnect 206) can be formed in the dielectric layer and adjacent to the metal anode. According to some implementations, the metal anode and the metal cathode can be formed in parallel to one another.

At 906, a first portion (e.g., the first portion 302) of a conductive material can be deposited on a first surface of the metal anode and a second portion (e.g., the second portion 304) of the conductive material can be deposited on a second surface of the metal cathode. According to some implementations, depositing the first portion and the second portion can comprise depositing at least one conductive material selected from a group of conductive materials comprising copper (Cu), aluminum (Al), metal silicide, cobalt (Co), ruthenium (Ru), and tungsten (W). The first portion can be grown to a first thickness, at 908. Further, the second portion can be grown to a second thickness, at 910. The first thickness and the second thickness can be defined by a spacing between the metal anode and the metal cathode. In some implementations, the first thickness and the second thickness can be less than a third thickness defined during a lithography process.

For example, in some implementations, a spacing or separation between the metal anode and the metal cathode within the dielectric layer can be a defined distance that can be selected based on a defined height of the first portion and the second portion. For example, a thickness of a fuse element created by the first portion and the second portion can be rendered thicker or thinner based on the spacing. Accordingly, a defined dimension of the fuse element can be controlled based on a spacing between the metal anode and the metal cathode.

At 912, the metal anode and the metal cathode can be electrically connected based on a growth of the first portion of the conductive material and the second portion of the conductive material into a fuse element. For example, the first portion and the second portion can be grown such that the width of the portions expands to contact or merge with one another.

The first portion and the second portion can be block masked and patterned, at 914, to define a width of the fuse element created during the growth of the first portion and the second portion. For example, one or more areas of the first portion and the second portion can be selectively removed to expose a top surface of the dielectric layer.

Figure 10:
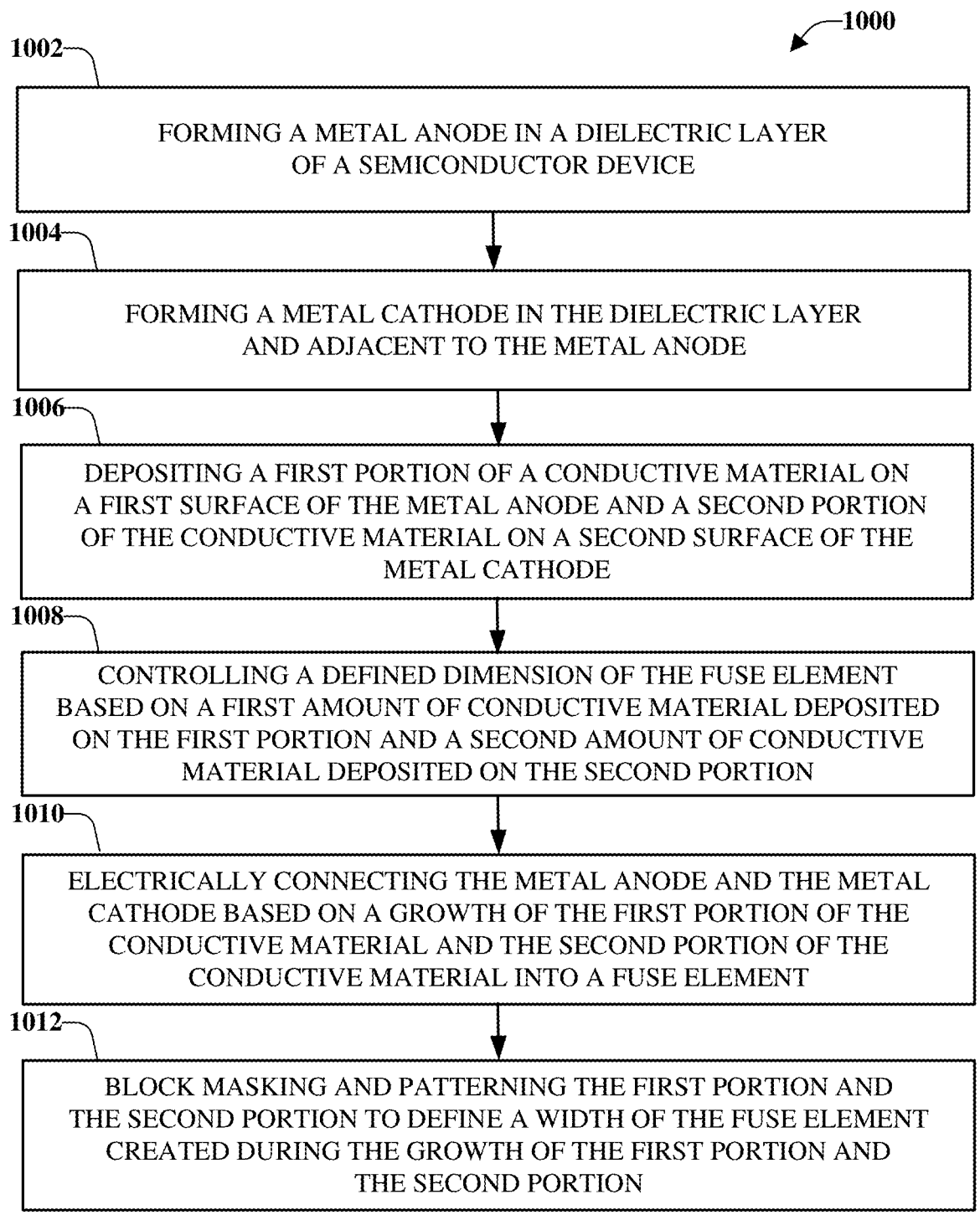
FIG. 10 illustrates a flow diagram of another example, non-limiting method for fabricating a three-dimensional vertical electrical fuse device in accordance with one or more embodiments described herein.

FIG. 10 illustrates a flow diagram of another example, non-limiting method 1000 for fabricating a three-dimensional vertical electrical fuse device in accordance with one or more embodiments described herein. Repetitive description of like elements employed in other embodiments described herein is omitted for sake of brevity.

The method 1000 starts, at 1002, when a metal anode (e.g., the first interconnect 102, the first interconnect 204) can be formed in a dielectric layer of a semiconductor chip. At 1004, a metal cathode (e.g., the second interconnect 104, the second interconnect 206) can be formed in the dielectric layer and adjacent to the metal anode. At 1006, a first portion of a conductive material (e.g., the first portion 302) can be deposited on a first surface of the metal anode and a second portion (e.g., the second portion 304) of the conductive material can be deposited on a second surface of the metal cathode.

A defined dimension of the fuse element (which can be defined by the first portion and the second portion) can be controlled, at 1008, based on a first amount of conductive material deposited on the first portion and a second amount of conductive material deposited on the second portion. At 1010, the metal anode and the metal cathode can be electrically connected based on a growth of the first portion of the conductive material and the second portion of the conductive material into a fuse element. For example, an amount of expansion (e.g., growth) of the first portion and the second portion can be less or more depending on the amount of conductive material deposited. Accordingly, a critical dimension of the three-dimensional vertical electrical fuse can be defined by the fuse element deposition.

The first portion and the second portion can be block masked and patterned, at 1012, to define a width of the fuse element created during the growth of the first portion and the second portion. For example, one or more areas of the first portion and the second portion can be selectively removed to expose a top surface of the dielectric layer. According to some implementations, the semiconductor chip can comprise one or more three-dimensional vertical electrical fuse devices. The one or more three-dimensional vertical electrical fuse devices can comprise different fuse element thicknesses across the semiconductor chip.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 11:
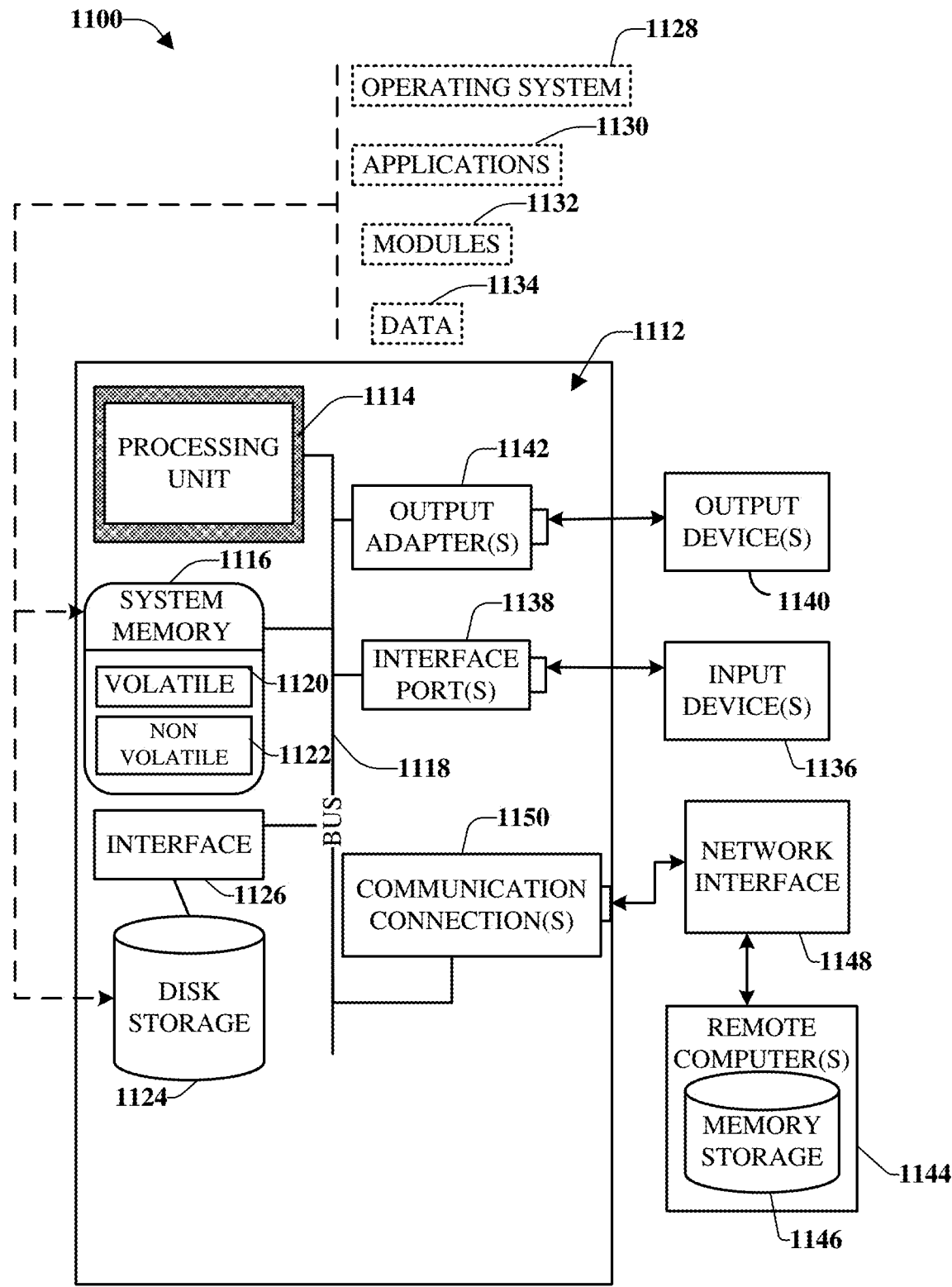
FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity. With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1120 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1112 can also include removable/non-removable, volatile/nonvolatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112. System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a method of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

One or more embodiments may be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a first metal interconnect formed in a dielectric layer of a semiconductor chip;
a second metal interconnect formed in the dielectric layer and adjacent to the first metal interconnect; and
a vertical electrical fuse element comprising a first portion of a conductive material deposited on a first surface of the first metal interconnect and in contact with a second portion of the conductive material deposited on a second surface of the second metal interconnect, wherein the vertical electrical fuse element comprises a first region comprising a first thickness and a second region comprising a second thickness different than the first thickness, wherein the first portion of the conductive material is wider than a first width of the first metal interconnect; wherein the second portion of the conductive material is wider than a second width of the second metal interconnect, wherein a first height of the first portion of the conductive material and a second height of the second portion of the conductive material are thicker above the first metal interconnect and the second metal interconnect than a third height of the first portion of the conductive material and a fourth height of the second portion of the conductive material at a connection point between the first portion of the conductive material and the second portion of the conductive material, wherein the second portion and the first portion are formed in a mushroom cap shape, wherein a measure of width is distinct from a measure of thickness, wherein the measure of width is a measurement in a direction parallel to a surface between the first metal interconnect and the conductive material, and wherein the measure of thickness is a measurement in a direction perpendicular to a surface between the first metal interconnect and the conductive material.

2. The device of claim 1, wherein the first portion of the conductive material and the second portion of the conductive material are wider than the first surface and the second surface.

3. The device of claim 1, wherein a spacing between the first metal interconnect and the second metal interconnect creates a defined dimension of the vertical electrical fuse element.

4. The device of claim 1, wherein a first amount of conductive material deposited on the first surface and a second amount of conductive material deposited on the second surface defines respective heights of the vertical electrical fuse element.

5. The device of claim 1, wherein the conductive material comprises at least one conductive material selected from a group of conductive materials consisting of copper (Cu), aluminum (Al), metal silicide, cobalt (Co), ruthenium (Ru), and tungsten (W).

6. The device of claim 1, wherein the first thickness is determined based on a first amount of conductive material deposited on the first surface and a distance between the first metal interconnect and the second metal interconnect.

7. The device of claim 6, wherein the second thickness is determined based on a second amount of conductive material deposited on the second surface and the distance between the first metal interconnect and the second metal interconnect.

8. The device of claim 1, wherein the first thickness and the second thickness are narrower than a third thickness definable by lithography.

9. The device of claim 1, wherein the device is a three-dimensional vertical electrical fuse device.

10. The device of claim 1, wherein the semiconductor chip comprises one or more three-dimensional vertical electrical fuse devices.

11. A vertical electrical fuse device, comprising:
a first metal interconnect formed in a dielectric layer of a semiconductor chip;
a second metal interconnect formed in the dielectric layer and adjacent to the first metal interconnect; and
a vertical electrical fuse element comprising a first portion of a conductive material deposited on a first surface of the first metal interconnect and in contact with a second portion of the conductive material deposited on a second surface of the second metal interconnect, wherein the vertical electrical fuse element comprises a first region comprising a first thickness and a second region comprising a second thickness different than the first thickness, wherein the first portion of the conductive material is wider than a first width of the first metal interconnect; wherein the second portion of the conductive material is wider than a second width of the second metal interconnect, wherein a first height of the first portion of the conductive material and a second height of the second portion of the conductive material are thicker above the first metal interconnect and the second metal interconnect than a third height of the first portion of the conductive material and a fourth height of the second portion of the conductive material at a connection point between the first portion of the conductive material and the second portion of the conductive material, wherein the second portion and the first portion are formed in a mushroom cap shape, wherein a measure of width is distinct from a measure of thickness, wherein the measure of width is a measurement in a direction parallel to a surface between the first metal interconnect and the conductive material, and wherein the measure of thickness is a measurement in a direction perpendicular to a surface between the first metal interconnect and the conductive material.

12. The vertical electrical fuse device of claim 11, wherein a spacing between the first metal interconnect and the second metal interconnect creates a defined dimension of the vertical electrical fuse element.

13. The vertical electrical fuse device of claim 11, wherein a first amount of conductive material deposited on the first surface and a second amount of conductive material deposited on the second surface defines respective heights of the vertical electrical fuse element.

14. The vertical electrical fuse device of claim 13, wherein the conductive material comprises at least one conductive material selected from a group of conductive materials consisting of copper (Cu) and aluminum (Al).

15. The vertical electrical fuse device of claim 13, wherein the conductive material comprises at least one conductive material selected from a group of conductive materials consisting of metal silicide, cobalt (Co), ruthenium (Ru), and tungsten (W).

16. A device, comprising:
a first metal interconnect formed in a dielectric layer of a semiconductor chip;

a second metal interconnect formed in the dielectric layer and adjacent to the first metal interconnect; and a vertical electrical fuse element comprising a first portion of a conductive material deposited on a first surface of the first metal interconnect and in contact with a second portion of the conductive material deposited on a second surface of the second metal interconnect, wherein the first portion of the conductive material is wider than a first width of the first metal interconnect; wherein the second portion of the conductive material is wider than a second width of the second metal interconnect, wherein a first height of the first portion of the conductive material and a second height of the second portion of the conductive material are thicker above the first metal interconnect and the second metal interconnect than a third height of the first portion of the conductive material and a fourth height of the second portion of the conductive material at a connection point between the first portion of the conductive material and the second portion of the conductive material, wherein the second portion and the first portion are formed in a mushroom cap shape, wherein a measure of width is distinct from a measure of thickness, wherein the measure of width is a measurement in a direction parallel to a surface between the first metal interconnect and the conductive material, and wherein the measure of thickness is a measurement in a direction perpendicular to a surface between the first metal interconnect and the conductive material.

17. The device of claim 16, wherein the first portion of the conductive material and the second portion of the conductive material are wider than the first surface and the second surface.

18. The device of claim 16, wherein the conductive material comprises at least one conductive material selected from a group of conductive materials consisting of copper (Cu), aluminum (Al), metal silicide, cobalt (Co), ruthenium (Ru), and tungsten (W).

\* \* \* \* \*